United States Patent [19]

Chung et al.

[11] Patent Number: 5,563,439
[45] Date of Patent: Oct. 8, 1996

[54] VARIABLE OPERATION SPEED MOS TRANSISTOR

[75] Inventors: Jin Y. Chung; Deog Y. Kwak, both of Seoul; Chang M. Khang, Chungcheongbuk-do, all of Rep. of Korea

[73] Assignee: Goldstar Electron Co., Ltd., Cheongju, Rep. of Korea

[21] Appl. No.: 995,862

[22] Filed: Dec. 23, 1992

[30] Foreign Application Priority Data

Dec. 24, 1991 [KR] Rep. of Korea ............... 91-23692

[51] Int. Cl.⁶ ................ H01L 29/76; H01L 29/94; H01L 31/062; H01L 31/113
[52] U.S. Cl. ............ 257/365; 257/364; 257/368; 257/379; 257/392; 257/401; 327/379
[58] Field of Search .................. 257/392, 368, 257/401, 364, 379, 365; 307/572

[56] References Cited

U.S. PATENT DOCUMENTS

4,771,195  9/1988  Stein ........................... 257/365

*Primary Examiner*—Steven H. Loke
*Attorney, Agent, or Firm*—Alan R. Loudermilk

[57] ABSTRACT

A variable operation speed MOS transistor having a source, a drain and a gate with a plurality of contacts formed thereon. One end of the gate of the variable operation speed MOS transistor is connected to drains/sources of first MOS transistors, while the plurality of the contacts formed on the gate of the variable operation speed MOS transistor are connected to the drains/sources of second MOS transistors, which are of an opposite type to that of the first MOS transistors, and the source or drains of which are connected to Vcc. Input signals are supplied to the respective gates of the first and second MOS transistors in such a manner as to adjust the turn-on and turn-off speeds of the variable operation speed MOS transistor.

34 Claims, 6 Drawing Sheets

VARIABLE OPERATION SPEED MOS TRANSISTOR

BACKGROUND OF THE INVENTION

1. Field of the Invention

The present invention relates to variable operation speed transistors, and more particularly to a MOS transistor for which the operation speed is different depending on the input signals, thereby making it possible to turn on the MOS transistor at a high speed, and to turn off the MOS transistor at a low speed, or vice versa.

2. Description of Prior Art

Figure 1:
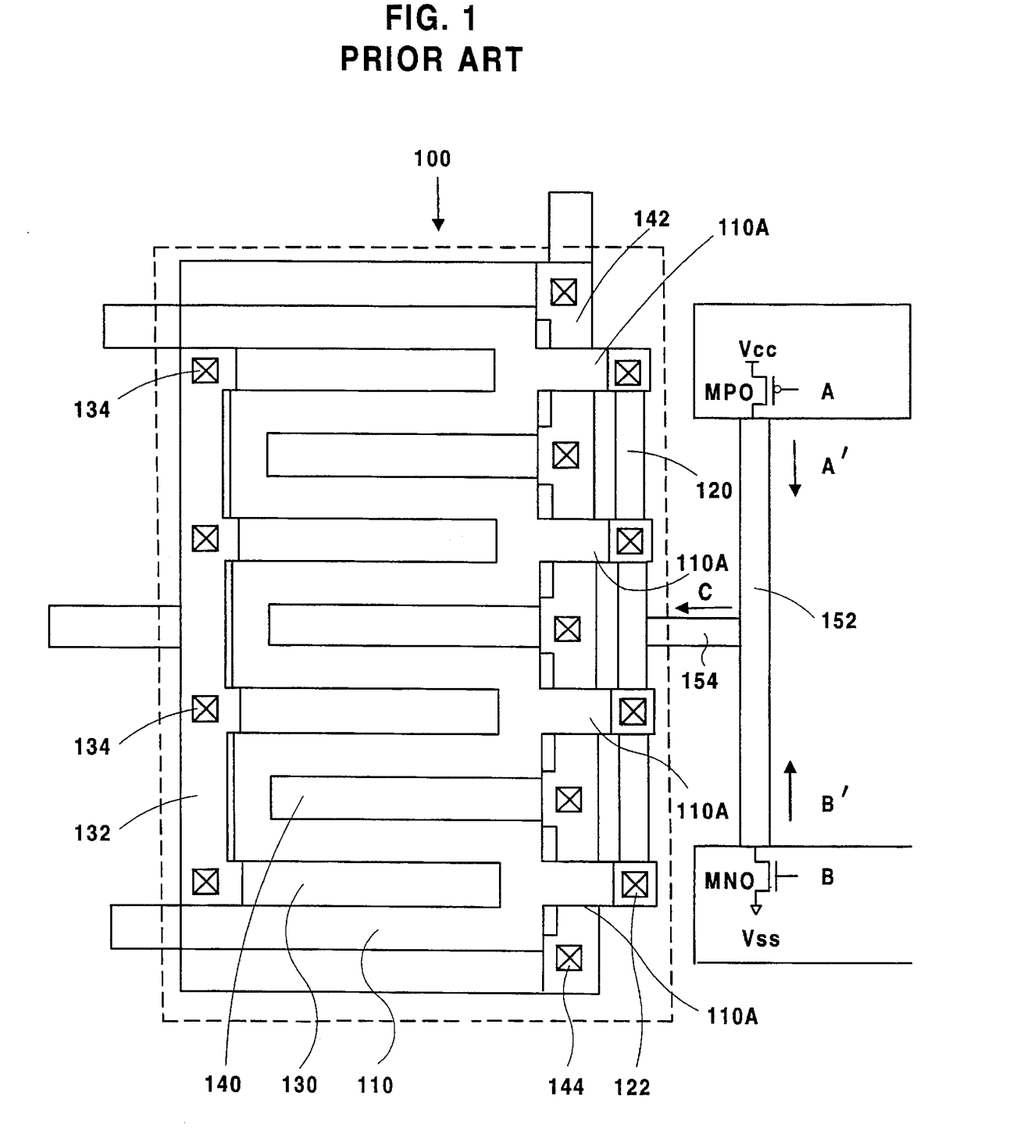
FIGS. 1 and 2 schematically illustrate the layout of a conventional transistor.
Figure 2:
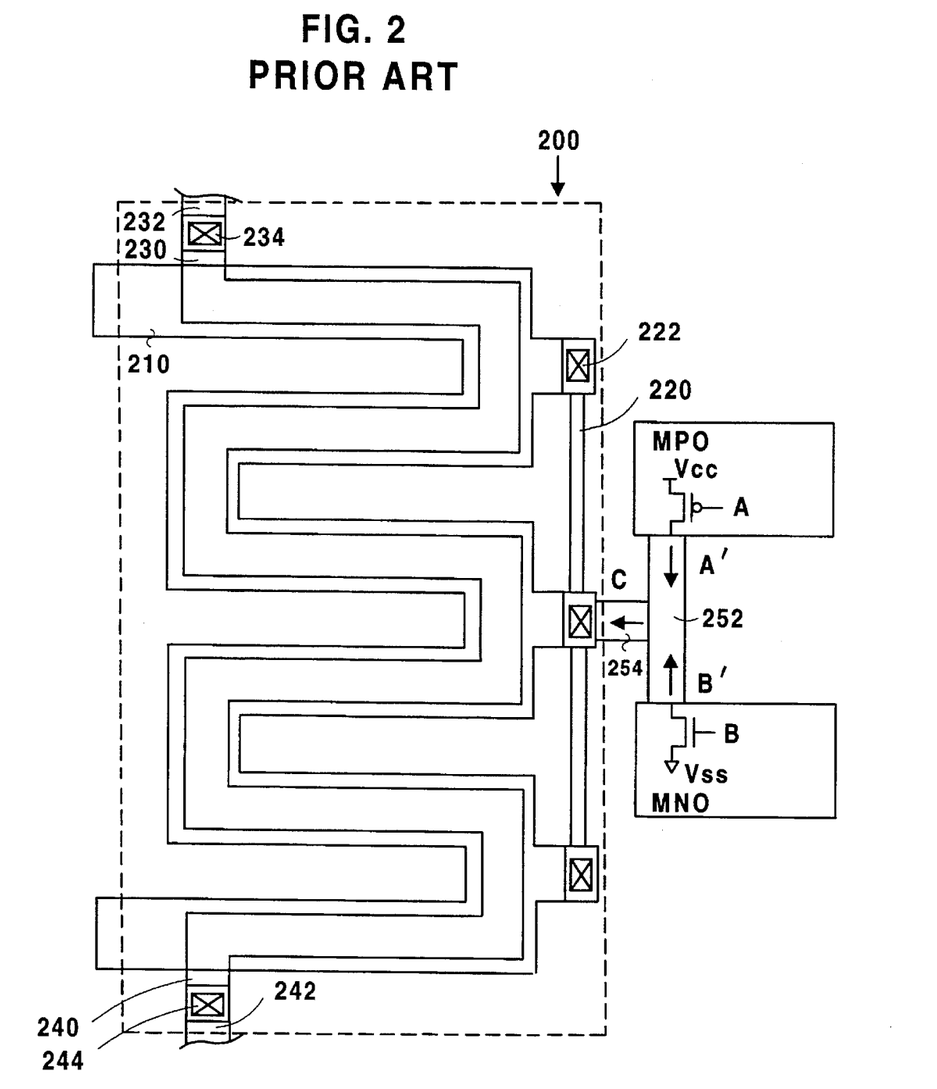

FIGS. 1 and 2 illustrate the layout of conventional MOS-FET 100.

Referring to FIG. 1, there is illustrated the layout of a MOS transistor in which the width of gate 110 is increased to increase the current capacity. Further, for this transistor, source 130 and drain 140 are formed at opposite sides of gate 110. The source or drain regions may be referenced with different names depending on the type of the substrate and the direction of the current, and thus are herein referred to as "source/drain" regions. Input signal A is supplied to the gate of PMOS transistor MP0 having its source connected to Vcc, while input signal B is supplied to the gate of NMOS transistor MN0 having its source connected to Vss. The drain of transistor MP0 and the drain of transistor MN0 are commonly connected to line 152, and they are further connected through line 154 (which is connected to line 152) to gate 110 of transistor 100.

Source region 130 is connected through contact 134 to metallic line 132 for other connection(s), while drain region 140 is connected through contact 144 to metallic line 142 for other connection(s).

If the two input signals A and B are supplied to gate 110 of the MOS transistor, the two input signals are transformed into an output signal A' of transistor MP0 and an output signal B' of transistor MN0, and then, these signals are further combined into a signal C, which is supplied through metallic line 120 to gate 110 of MOS transistor 100. Reference numeral 122 indicates a contact between gate 110 and metallic line 120.

Accordingly, signal A' and signal B' pass through the same resistance and capacitance before being supplied to the total gate region.

Referring to FIG. 1, if signals A and B are high level, NMOS transistor MN0 is turned on, thus the potential of gate 110 is lowered to ground potential, Vss. Signals A and B are transformed into signals A' and B' and signal C (combined A' and B') is supplied to gate 110 through parallel lines 110A, and thus the resistance is reduced, and a short time delay occurs.

Meanwhile, if input signals A and B drop to a low potential, PMOS transistor MP0 is turned on, and thus the potential of gate 110 is elevated to Vcc. Signals A and B are transformed into signals A' and B', and signal C is supplied through parallel lines to gate 110, and thus a short time delay occurs.

That is, the signal pass way is the same for making the potential of gate 110 high or low, and the resistance and capacitance remain constant.

FIG. 2 illustrates the layout of MOS transistor 200 in which the length of the gate is extended in order to decrease the current capacity. Source 230 and drain 240 are formed at the opposite ends of gate 210, and again the source/drain regions may be referenced with different names depending on the type of the substrate and the direction of current.

Input signal A is supplied to the gate of PMOS transistor MP0 having its source connected to Vcc, while input signal B is supplied to the gate of NMOS transistor NM0 having its source connected to Vss. The drain of transistor MP0 and the drain of transistor MN0 are commonly connected to line 252, and are further connected through line 254 (which is connected to line 252) to gate 210 of MOS transistor 200.

Source region 230 is connected through contact 234 to metallic line 232 to the outside, while drain region 240 is connected through contact 244 to metallic line 242 to the outside.

When the two signals A and B are supplied to gate 210 of MOS transistor 200, the two signals respectively become output signal A' of transistor MP0 and output signal B' of transistor MN0. Further, the two signals are combined into signal C, which is supplied through metallic line 220 to gate 210 of the MOS transistor. Reference numeral 222 indicates a contact between the gate 210 and metallic line 220.

Accordingly, signals A' and B' pass through the same resistance and capacitance pass way before being supplied to the whole region of the gate.

Referring to FIG. 2, if signals A and B are a high potential, the NMOS transistor MN0 is turned on, with the result that gate 210 is lowered to ground potential, Vss. Signals A and B are transformed into signals A' and B' and combined into signal C, which is supplied through parallel lines to gate 210, and a short time delay occurs.

Meanwhile, if input signals A and B drop to a low potential, PMOS transistor MP0 is turned on and NMOS transistor MN0 is turned off, with the result that gate 210 is elevated to a high potential, Vcc. Since signals A and B become signals A' and B' which are combined into signal C, which is supplied through parallel lines to gate 210, a short time delay occurs. That is, regardless of whether the potential of the gate is elevated or lowered, the resistance and capacitance of the signal pass way remain unchanged.

In the above described conventional technique, both when the potentials of gates 110 and 210 are elevated and lowered, the resistance and capacitance of the signal path remain unchanged. A signal to turn on the MOS transistor and a signal to turn off the MOS transistor are passed through the same path. Therefore, in the case where a marked difference is required between the gate potential elevating time and the gate potential lowering time, a separate resistor has to be installed on the signal path, thereby requiring a larger area.

SUMMARY OF THE INVENTION

It is an object of the present invention to provide a variable operation speed MOS transistor that operates with different operation speeds for turn-on and turn-off.

It is a further object of the present invention to provide a variable operation speed MOS transistor that has the characteristic of adjustable operation speed for turn-on and turn-off.

It is still a further object of the present invention to provide a variable operation speed MOS transistor that has the characteristics of high speed turn-on and low speed turn-off.

It is yet a further object of the present invention to provide a variable operation speed MOS transistor that has the characteristics of high speed turn-off and low speed turn-on.

The variable operation speed MOS transistor of the present invention comprises a drains a source, and a gate having a long length and having a plurality of contacts formed thereon, characterized in that one end of the gate is connected to a first input which is connected to a first voltage level through a first switching transistor, the plurality of contacts is connected to a second input which is connected to a second voltage level through a plurality of second switching transistors, whereby the turn-on and turn-off speeds of the variable operation speed MOS transistor are adjusted by turning on or turning off the first switching transistor and turning off or turning on the second switching transistors.

In the variable operation speed MOS transistor of the present invention, one end of the gate is connected to the drains/sources of one or more first MOS transistors, the source/drains of the one or more first MOS transistors are connected to Vss, a plurality of contacts formed at intermediate positions on the gate are connected to the drains/sources of second MOS transistors which are of an opposite type to that of the one or more first MOS transistors, the sources/drains of the second MOS transistors being connected to Vcc, and input signals are supplied to the respective gates of the first and second transistors in such a manner as to adjust the turn-on and turn-off speeds of the variable operation speed MOS transistor.

BRIEF DESCRIPTION OF THE DRAWINGS

The above objects and other advantages of the present invention will become more apparent by describing in detail the preferred embodiments of the present invention with reference to the attached drawings in which.

DESCRIPTION OF THE PREFERRED EMBODIMENTS

FIGS. 3 to 6 illustrate embodiments of the variable operation speed transistor according to the present invention.

The same reference numerals are assigned to the same functioning components for simplification of the description. For example, transistors 100 and 200 of the present invention have the same constitution as the conventional MOS transistors of FIGS. 1 and 2.

The MOS type variable operation speed transistor of the present invention has a source, a drain and a gate having a long length and having a plurality of input nodes (contacts). One end of the gate of the variable operation speed MOS transistor (VOS-MOSFET) is connected to the first input through a drain/source of the first MOS transistor in which its source/drain is connected to Vss (the first voltage level). The plurality of input nodes, which are formed at intermediate positions of the gate of the VOS-MOSFET, are connected to the second input through the drains/sources of second MOS transistors which are of an opposite type to that of the first MOS transistor, and in which their sources/drains are connected to Vcc (the second voltage level). Input signals are supplied to the gates of the first and second MOS transistors in order to adjust the speed of the turn-on and turn-off of the VOS-MOSFET.

If the speeds of the turn-on and turn-off of the VOS-MOSFET are to be made slow, the input for such a purpose is supplied to the gate of the first MOS transistor which is connected to one end of the gate of VOS-MOSFET, so that the RC time delay of the gate is increased during the transmission of the input signals. On the other hand, if the speeds of the turn-on and turn-off of the VOS-MOSFET are to be made fast, the input for such a purpose is supplied to the gates of the second MOS transistors which are connected to a plurality of contacts which are formed at intermediate positions of the gate of the VOS-MOSFET. Thus, the input signals are supplied evenly to the respective contacts of the gate, so that an RC delay occurs very little in the gate.

The VOS-MOSFET is a MOS transistor in which either the width of the gate (channel width) is increased for the purpose of increasing the current capacity, or the length of the gate (channel length) is extended for the purpose of decreasing the current capacity.

The first MOS transistor is an NMOS transistor, and the second MOS transistors are PMOS transistors, or vice versa.

For the input signals, the same wave patterns (the same signals) may be used, or different wave patterns (different signals) may be used.

Figure 3:
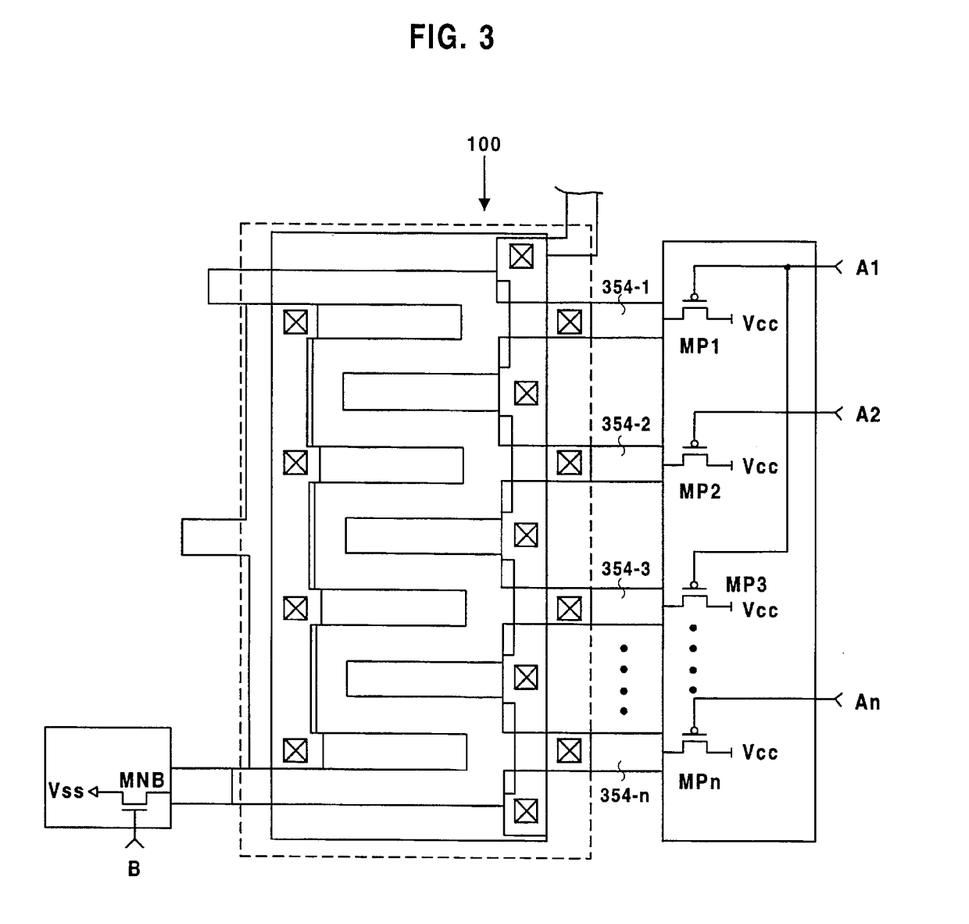
FIGS. 3 to 6 schematically illustrate the layout of transistors according to the present invention.

FIG. 3 illustrates a first embodiment of the MOS type VOS-MOSFET of the present invention aimed at increasing the current capacity. Input signals A1, A2, . . . , An are supplied to the respective gates of PMOS transistors MP1, MP2, . . . , MPn, with their sources connected to Vcc. The drains of transistors MP1, MP2, . . . , MPn are connected through metallic lines 354-1, 354-2, 354-3, . . . , 354-n to a proper position on the gate of variable operation speed transistor 100, which is the VOS-MOSFET. The drain of NMOS transistor MNB, the source of which is connected to Vss, is connected to one end (lengthwise direction) of the gate of the VOS-MOSFET, while its gate receives input signal B.

Figure 4:
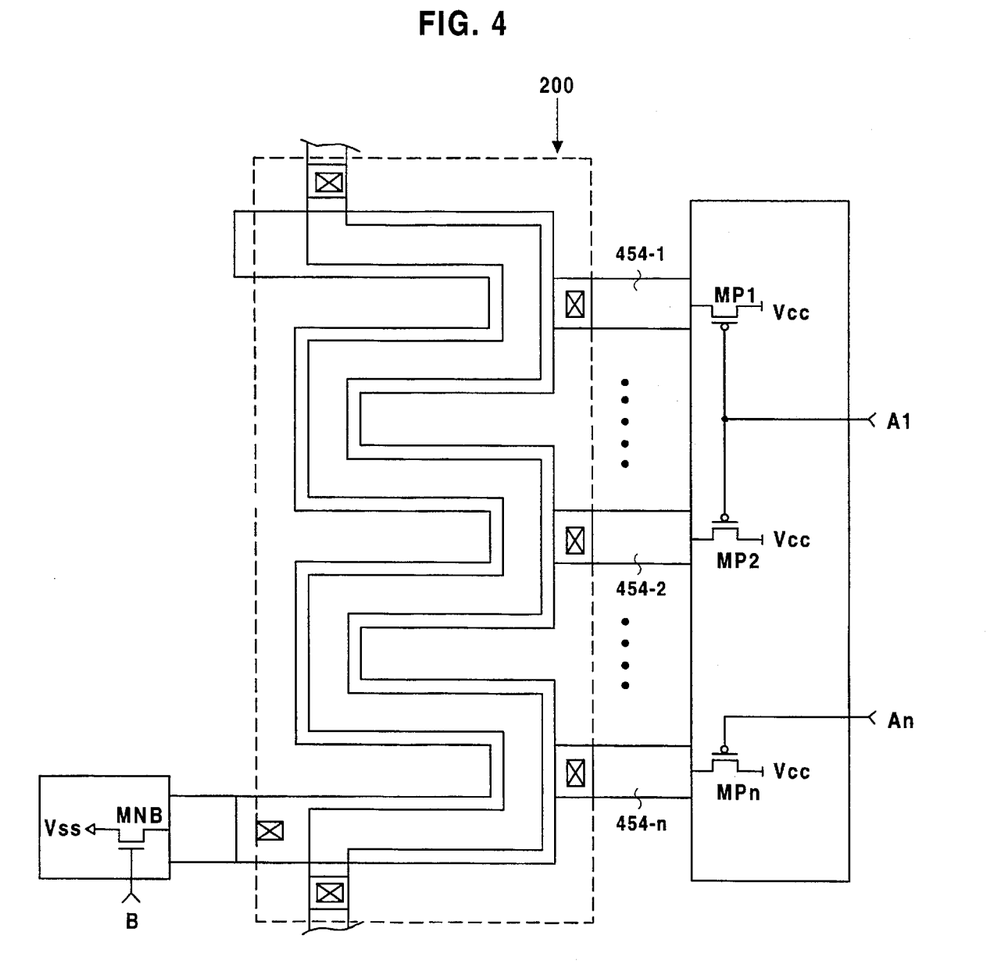

FIG. 4 illustrates a first embodiment of the MOS type VOS-MOSFET of the present invention aimed at decreasing the current capacity. Input signals A1, A2, . . . , An are supplied to the respective gates of PMOS transistors MP1, MP2, . . . , MPn, the sources of which are connected to Vcc. The respective drains of transistors MP1, MP2, . . . , MPn are connected through metallic lines 454-1, 454-2, . . . , 454-n to contacts which are formed at proper positions on the gate of variable operation speed transistor 200, which is a VOS-MOSFET. The drain of NMOS transistor MNB, the source of which is connected to Vss, is connected to the opposite end (lengthwise direction) of the VOS-MOSFET, while the gate of transistor MNB receives input signal B.

The transistors of the present invention constituted as above are operated in the manner described below. That is, referring to FIGS. 3 and 4, when signals A1, A2, . . . , An and signal B drops to a low level, PMOS transistors MP1, MP2, . . . , MPn are turned on, and NMOS transistor MNB is turned off, resulting in the potential of the gate of the VOS-MOSFET being elevated to a high level without causing any time delay.

On the other hand, when signals A1, A2, . . . , An and signal B are shifted to a high level, PMOS transistors MP1, MP2, . . . , MPn are turned off, and NMOS transistor MNB is turned on, resulting in the potential of the gate of the VOS-MOSFET dropping to a low level (Vss). Here, however, the resistance of the gate of the VOS-MOSFET acts to cause an RC delay. That is, when the potential of the gate of the VOS-MOSFET is elevatedr the shifting is made speedily without a time delay, while, when the potential of the gate of the VOS-MOSFET is lowered, an RC time delay slows down the shifting of the potential.

While FIGS. 3 and illustrate a single first MOS transistor, the present invention also may be utilized with first MOS transistors, with one end of the gate connected to the drains/sources of the first MOS transistors, the sources/drains of the first MOS transistors connected to Vss. In such embodiments, input signals are supplied to the respective gates of the first and second transistors in such a manner as to adjust-the turn-on and turn-off speeds of the variable operation speed MOS transistor.

Figure 5:
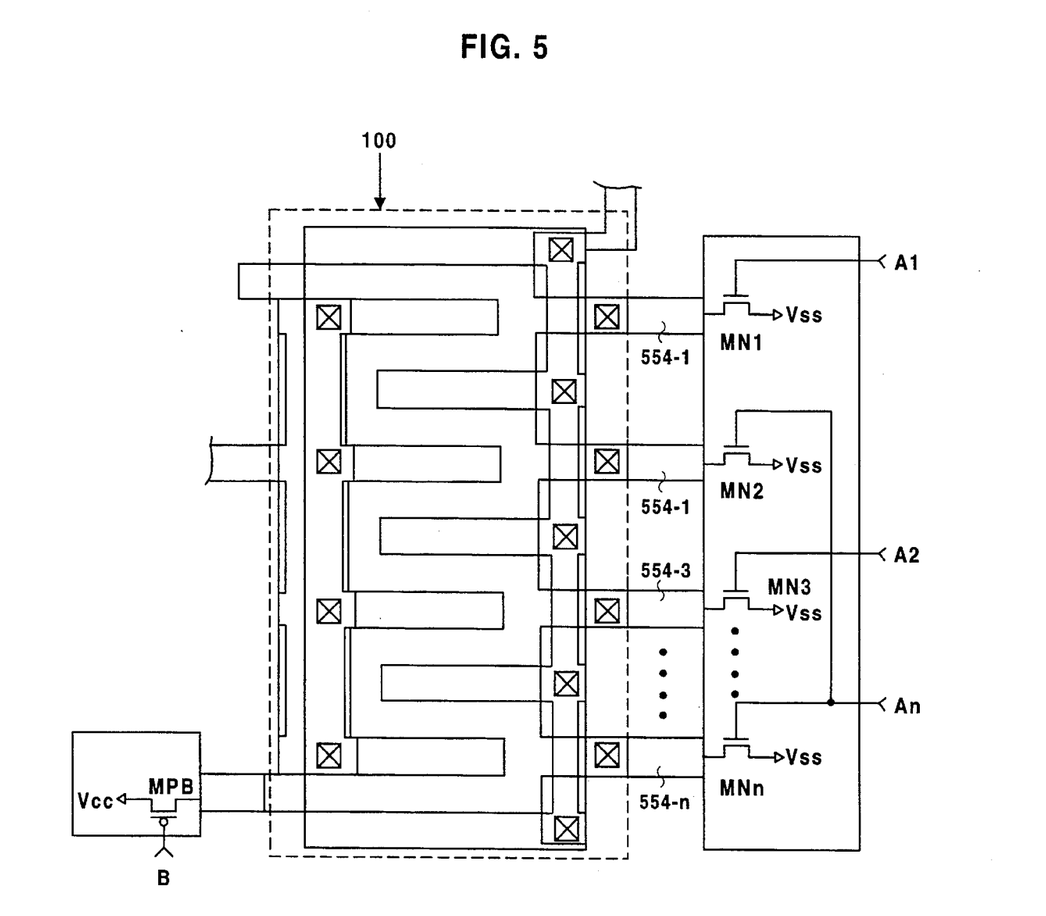

FIG. 5 illustrates a second embodiment of the MOS type VOS-MOSFET of the present invention aimed at increasing the current capacity. Instead of supplying input signals A1, A2, ..., An to transistors MP1, MP2, ..., MPn as in the first embodiment of FIG. 3, input signals A1, A2, ..., An are supplied to the respective gates of NMOS transistors MN1, MN2, ..., MNn, the sources of which are connected to Vss, and the drains of which are connected to proper positions on the gate of VOS-MOSFET 100. Input signal B is supplied to the gate of PMOS transistor MPB, the source of which is connected to Vcc. Further, the drain of PMOS transistor MPB is connected to one end of the gate of the VOS-MOSFET.

The respective drains of NMOS transistors MN1, MN2, ..., MNn, the sources of which are connected to Vss, are connected through metallic lines 554-1, 554-2, 554-3, ..., 554-n to contacts on the gate of variable operation speed transistor 100, which is a VOS-MOSFET. The drain of PMOS transistor MPB, the source of which is connected to Vcc, is connected to one end (lengthwise direction) of the gate of the VOS-MOSFET, while the gate of transistor MPB receives input signal B.

Figure 6:
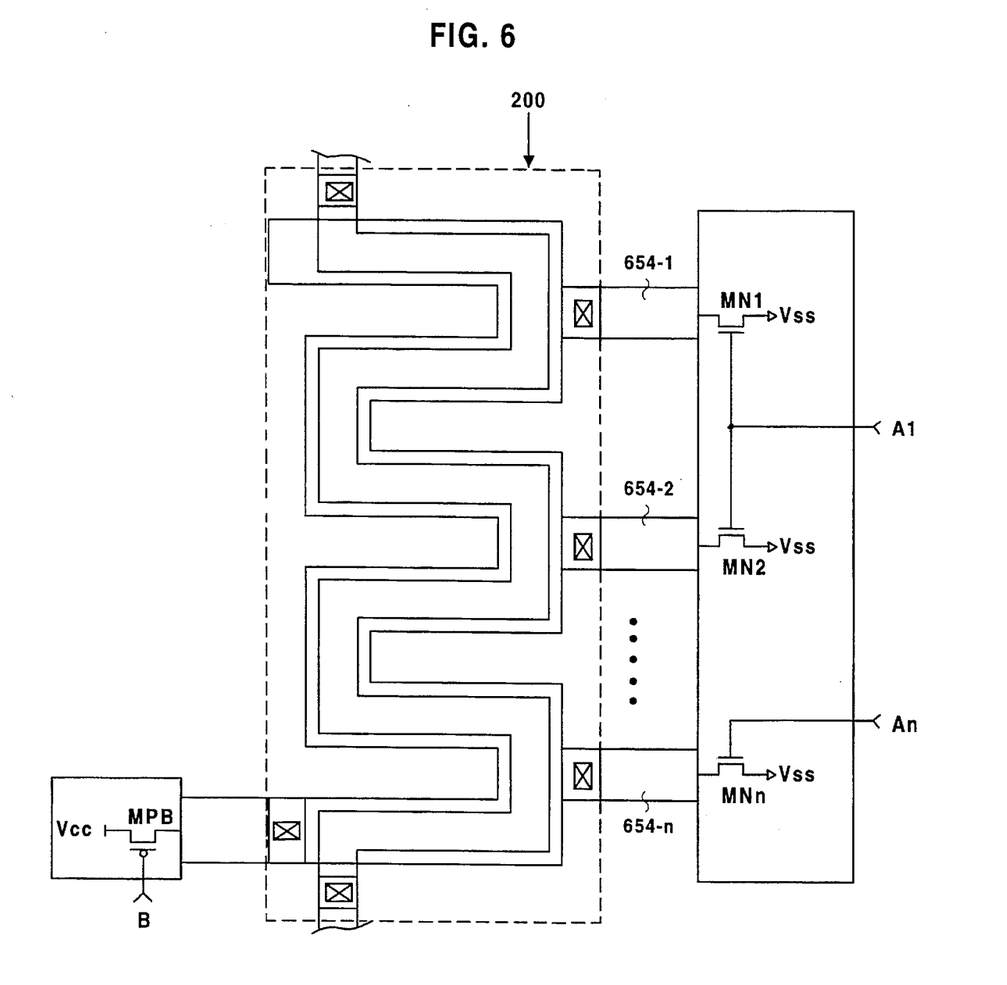

FIG. 6 illustrates a second embodiment of the MOS type VOS-MOSFET of the present invention aimed at decreasing the current capacity. Instead of supplying input signals A1, A2, ..., An to transistors MP1, MP2, ..., MPn, input signals A1, A2, ..., An are supplied to the respective gates of transistors MN1, MN2, ..., MNn, the sources of which are connected to Vss. The respective drains of transistors MN1, MN2, ..., MNn are connected through metallic lines 654-1, 654-2, 654-3, ..., 654-n to proper positions on the gate of variable operation speed transistor 200, which is a VOS-MOSFET. The drain of PMOS transistor MPB, the source of which is connected to Vcc, is connected to one end (lengthwise direction) of the gate of the VOS-MOSFET, while the gate of transistor MPB receives input signal B.

The transistors of FIGS. 5 and 6 constituted as above will now be described as to their operation. When signals A1, A2, ..., An and signal B drop to a low potential, NMOS transistors MN1, MN2, ..., MNn are turned off, and PMOS transistor MPB is turned on, resulting in the resistance and capacitance RC of the gate of the VOS-MOSFET acting to cause a time delay when elevating the potential of the gate to a high level. When signals A1, A2, ..., An and signal B are elevated to a high potential, NMOS transistors MN1, MN2, ..., MNn are turned on, and PMOS transistor MPB is turned off, resulting in the potential of the gate of the VOS-MOSFET dropping without a time delay.

As illustrated in FIGS. 3–6, the gate of the variable operation speed MOS transistor of the present invention may be formed in the shape of a "zig-zag", or what is generally known in the art as a "serpentine." Considering each horizontal portion of the gate as an "electrode" of the gate, as is illustrated in FIGS. 3–6, the electrodes of the zig-zag or serpentine gate may be arranged in a substantially constant spaced-apart relationship with adjacent electrodes. The gate of the variable operation speed MOS transistor of the present invention may be formed of polysilicon.

The VOS-MOSFET of the present invention may be a P type transistor or a N type transistor. If the VOS-MOSFET is a N type transistor, a high state of the gate the of VOS-MOSFET will cause the VOS-MOSFET to turn-on because the high state voltage level is higher than the threshold voltage of the N type VOS-MOSFET, and a low state of the gate of the VOS-MOSFET will cause the VOS-MOSFET to turn-off because the low state voltage level is lower than the threshold voltage of the N type VOS-MOSFET, and vice versa if the VOS-MOSFET is a P type transistor. As is known in the art, applying a voltage to the gate of an N type MOSFET that is above the threshold voltage of the N type MOSFET will cause the MOSFET to turn-on, and applying a voltage to the gate of an N type MOSFET that is below the threshold voltage of the N type MOSFET will cause the MOSFET to turn-off, and vice versa with respect to P type MOSFETs.

In the above descriptions, it was assumed that the operations were carried out with the same wave patterns of input signals A1, A2, ..., An and signal B. However, if the wave patterns of the input signals are made different, more diversified operation characteristics may be obtained.

According to the present invention as described above, a plurality of input signals are supplied to the gate of a VOS-MOSFET in such a manner that an RC time delay is permitted to occur by supplying input signals directly to the gate of the VOS-MOSFET, and that the other end of the gate of the transistor is connected in parallel so as for an RC delay not to occur, thereby differentiating the stepping-up speed and the stepping-down speed of the potential without using a separate resistor.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A variable operation speed MOS transistor comprising;

a first diffusion region;

a second diffusion region;

a gate having a length and a plurality of electrodes formed at intermediate positions along the length of the gate; and a plurality of voltage sources coupled to the electrodes of the gate, wherein the plurality of voltage sources are selectively coupled to the electrodes of the gate in response to a plurality of signals having a variable pattern of high or low level, wherein one of the turn-on speed and turn-off speed of the MOS transistor varies in response to variation of the pattern of the high or low level of the plurality of signals.

2. A variable operation speed MOS transistor as claimed in claim 1, wherein the plurality of voltage sources are selectively coupled to the electrodes of the gate by a plurality of switching means.

3. A variable operation speed MOS transistor as claimed in claim 2, wherein the plurality of switching means comprise PMOS transistors and one of the voltage sources provide a voltage level higher than the threshold voltage of the variable operation speed MOS transistor.

4. A variable operation speed MOS transistor as claimed in claim 2, wherein the plurality of switching means comprises NMOS transistors and one of the voltage sources provide a voltage level lower than the threshold voltage of the variable operation speed MOS transistor.

5. A variable operation speed MOS transistor as claimed in claim 1, wherein at least one electrode of the plurality of electrodes of the gate is coupled to one of the voltage sources of a voltage level lower than the threshold voltage of the variable operation speed MOS transistor.

6. A variable operation speed MOS transistor as claimed in claim 5, wherein the electrodes of the gate other than the at least one electrode are coupled to another one of said voltage sources of a voltage level higher than the threshold voltage of the variable operation speed MOS transistor, and the electrodes of the gate are arranged in a substantially constant spaced-apart relationship with adjacent electrodes.

7. A variable operation speed MOS transistor as claimed in claim 1, wherein the electrodes of the gate are coupled to one of the voltage sources of a voltage level higher than the threshold voltage of the variable operation speed MOS transistor, and the electrodes of the gate are arranged in a substantially constant spaced-apart relationship with adjacent electrodes.

8. A variable operation speed MOS transistor as claimed in claim 1, wherein the gate is formed in a zig-zag shape.

9. A variable operation speed MOS transistor as claimed in claim 1, wherein the gate is formed of polysilicon.

10. A variable operation speed MOS transistor as claimed in claim 1, wherein the gate has a plurality of projections extending from the gate at intermediate positions along the length of the gate, wherein the electrodes of the gate are formed from the plurality of projections from the gate.

11. A variable operation speed MOS transistor comprising a drain, a source, and a gate having a length and a first contact and a plurality of second contacts formed thereon, wherein:

the first contact of the gate is connected to a first switching device connected to a first voltage level, the first switching device being controlled by a first signal; and the plurality of second contacts of the gate are connected to a plurality of second switching devices connected to a second voltage level, the second switching devices being controlled by a plurality of second signals of a variable pattern, wherein the variable pattern of second signals comprise signals each having a high or low level, wherein one of the turn-on speed and turn-off speed of the MOS transistor varies dependent upon the variable pattern of the high or low level of the second signals.

12. A variable operation speed MOS transistor as claimed in claim 11, wherein the first switching device comprises a first switching transistor, and the second switching devices comprise a plurality of second switching transistors, wherein the turn-on speed of the variable operation speed MOS transistor is controlled to be different from the turn-off speed of the variable operation speed MOS transistor by the pattern of the high or low level of the second signals.

13. A variable operation speed MOS transistor as claimed in claim 11, wherein the first voltage level is Vss, the first switching device comprises an NMOS transistor, the second voltage level is Vcc, and the second switching devices comprise PMOS transistors, wherein the turn-on speed of the variable operation speed MOS transistor is controlled to be different from the turn-off speed of the variable operation speed MOS transistor by the pattern of the high or low level of the second signals.

14. A variable operation speed MOS transistor as claimed in claim 11, wherein the first voltage level is Vcc, the first switching device comprises a PMOS transistor, the second voltage level is Vss, and the second switching devices comprise NMOS transistors, wherein the turn-on speed of the variable operation speed MOS transistor is controlled to be different from the turn-off speed of the variable operation speed MOS transistor by the pattern of the high or low level of the second signals.

15. A variable operation speed MOS transistor as claimed in claim 11, wherein the gate has first and second sides along the length thereof, wherein the drain is formed at the first side along the length of the gate, and the source is formed at the second side along the length of the gate, wherein the variable operation speed MOS transistor has a current carrying capacity determined by the length of the gate.

16. A variable operation speed MOS transistor comprising a drain, a source, and a gate having a length and a first end and a plurality of contacts formed at intermediate positions thereon, wherein:

the first end of the gate is connected to the drain of a first MOS transistor of a first conductivity type, the source of the first MOS transistor being connected to Vss;

the plurality of contacts are connected to the drains of second MOS transistors of a second conductivity type, the sources of the second MOS transistors being connected to Vcc; and input signals of a variable pattern of high or low level supplied to the respective gates of the first and second transistors vary one of the turn-on speed and turn-off speed of the variable operation speed MOS transistor, wherein variation of the pattern of the high or low level input signals results in variation of said one of the turn-on speed and turn-off speed of the variable operation speed MOS transistor.

17. The variable operation speed MOS transistor as claimed in claim 16, wherein the variable pattern input signals include a first input signal for a first turn-on speed of the variable operation speed MOS transistor supplied to the gate of the first MOS transistor, wherein a first RC time delay occurs during the transmission of the first input signal; and the variable pattern input signals also include a plurality of second input signals for a second turn-on speed of the variable operation speed MOS transistor supplied to the gates of the second MOS transistors, wherein a second RC time delay occurs during the transmission of the second input signals, wherein the first RC time delay is longer than the second RC time delay, and wherein the second turn-on speed is greater than the first turn-on speed.

18. The variable operation speed MOS transistor as claimed in claim 17, wherein the gate of the variable operation speed MOS transistor is provided with a width, wherein the variable operation speed MOS transistor has a current carrying capacity determined by the width of the gate.

19. The variable operation speed MOS transistor as claimed in claim 17, wherein the variable operation speed MOS transistor has a current carrying capacity determined by the length of the gate.

20. The variable operation speed MOS transistor as claimed in claim 17, wherein the first MOS transistor is NMOS type, and the second MOS transistors are PMOS type.

21. The variable operation speed MOS transistor as claimed in claim 17, wherein the first and second input signals are controlled to have substantially the same pattern.

22. The variable operation speed MOS transistor as claimed in claim 17, wherein the first and second input signals are of different patterns.

23. The variable operation speed MOS transistor as claimed in claim 16, wherein the first MOS transistor is NMOS type, and the second MOS transistors are PMOS type.

24. A variable operation speed MOS transistor comprising a drain, a source, and a gate having a length, a first side and a second side, wherein each side is disposed along the length of the gate, and a first contact and a plurality of second contacts formed thereon, wherein:

the first contact of the gate is connected to a first switching device connected to a first voltage level; and the plurality of second contacts of the gate are connected to a plurality of second switching devices connected to a second voltage level, wherein the second switching devices are controlled by variable control signals, wherein the drain is formed at the first side of the gate, and the source is formed at the second side of the gate, wherein the variable operation speed MOS transistor has one of the turn-on speed and turn-off speed that varies in response to the variable control signals.

25. A variable operation speed MOS transistor comprising a drain, a source, and a gate having a length, a first end and a second end and a plurality of contacts formed at intermediate positions thereon, wherein:

the first end of the gate is connected to drains of a first set of MOS transistors of a first conductivity type, the sources of the first set of MOS transistors being connected to Vss;

the plurality of contacts are connected to the drains of a second set of MOS transistors of a second conductivity type, the sources of the second set of MOS transistors being connected to Vcc; and a plurality of input signals supplied to the respective gates of the transistors of the first and second sets of transistors, wherein one of the turn-on speed and turn-off speed of the variable operation speed MOS transistor varies depending upon the input signals supplied to the gates of the transistors of the first and second sets of transistors.

26. The variable operation speed MOS transistor as claimed in claim 25, wherein:

first input signals are applied to the gates of the first set of MOS transistors, wherein a first RC time delay occurs in response to the first input signals; and second input signals are applied to the gates of the second set of MOS transistors, wherein a second RC time delay occurs in response to the second input signals.

27. The variable operation speed MOS transistor as claimed in claim 26, wherein the first RC time delay is longer than the second RC time delay.

28. The variable operation speed MOS transistor as claimed in claim 26, wherein the first set of MOS transistors are NMOS type, and the second set of MOS transistors are PMOS type.

29. The variable operation speed MOS transistor as claimed in claim 25, wherein the gate of the variable operation speed MOS transistor is provided with a width, wherein the variable operation speed MOS transistor has a current carrying capacity determined by the width of the gate.

30. The variable operation speed MOS transistor as claimed in claim 25, wherein the variable operation speed MOS transistor has a current carrying capacity determined by the length of the gate.

31. The variable operation speed MOS transistor as claimed in claim 25, wherein the first set of MOS transistors are NMOS type, and the second set of MOS transistors are PMOS type.

32. An MOS transistor, comprising:

a gate having a length, opposite sides disposed along the length of the gate, first and second ends and a plurality of contacts to the gate at positions along the length thereof;

a source region and a drain region positioned adjacent to and on the opposite sides of the gate;

a first switching transistor coupled between the first end of the gate and a first power supply and controlled by a first signal;

a plurality of second switching transistors coupled between the contacts to the gate and a second power supply and controlled by a plurality of second signals of varying high or low level;

wherein, one of the turn-on speed and turn-off speed of the MOS transistor varies depending upon variations in the high or low level of the second signals.

33. The transistor as claimed in claim 32, wherein the gate is in the shape of a zig-zag, wherein the source and drain regions are positioned on opposite sides along the length of the gate.

34. The transistor as claimed in claim 32, wherein the gate is in the shape of a zig-zag, wherein the source and drain regions are positioned at the first and second ends of the gate.

* * * * *